United States Patent
Ker et al.

(10) Patent No.: US 7,525,159 B2
(45) Date of Patent: *Apr. 28, 2009

(54) TURN-ON-EFFICIENT BIPOLAR STRUCTURES FOR ON-CHIP ESD PROTECTION

(76) Inventors: Ming-Dou Ker, Bldg. 51, 195, Chung Hsing Rd., Sec. 4, Chutung, Hsinchu (TW) 310; Che-Hao Chuang, Bldg. 51, 195, Chung Hsing Rd., Sec. 4, Chutung, Hsinchu (TW) 310

( * ) Notice: Subject to any disclaimer, the term of this patent is extended or adjusted under 35 U.S.C. 154(b) by 0 days.

This patent is subject to a terminal disclaimer.

(21) Appl. No.: 11/768,785

(22) Filed: Jun. 26, 2007

(65) Prior Publication Data

US 2007/0290266 A1    Dec. 20, 2007

Related U.S. Application Data

(63) Continuation of application No. 10/727,550, filed on Dec. 5, 2003, now Pat. No. 7,244,992.

(60) Provisional application No. 60/487,581, filed on Jul. 17, 2003.

(51) Int. Cl.
*H01L 23/62* (2006.01)
*H01L 21/332* (2006.01)

(52) U.S. Cl. .............. 257/355; 257/356; 257/361; 257/362; 257/E21.068; 257/E21.069; 438/154; 438/155; 438/166; 438/371

(58) Field of Classification Search .......... 257/355, 257/356, 361; 438/154, 155
See application file for complete search history.

(56) References Cited

U.S. PATENT DOCUMENTS

| | | | |
|---|---|---|---|
| 5,637,901 A | 6/1997 | Beigel et al. | |
| 5,744,842 A | 4/1998 | Ker | |
| 6,072,219 A | 6/2000 | Ker et al. | |
| 6,281,527 B1 * | 8/2001 | Chen | 257/168 |
| 6,348,724 B1 | 2/2002 | Koomen et al. | |
| 6,566,715 B1 | 5/2003 | Ker et al. | |
| 6,642,088 B1 | 11/2003 | Yu | |
| 7,244,992 B2 * | 7/2007 | Ker et al. | 257/355 |
| 2002/0130390 A1 | 9/2002 | Ker et al. | |
| 2004/0065895 A1 * | 4/2004 | Lai et al. | 257/107 |

OTHER PUBLICATIONS

Duvvury, et al.; "ESD: A pervasive reliability concern for IC technologies"; Proceedings of the IEEE; vol. 81; May 1993; pp. 690-702.
Chen, et al.; "Investigation of the gate driven effect and substrate-triggered effect on ESD robustness of CMOS devices"; IEEE Transactions on Device and Materials Reliability; vol. 1; Dec. 2001; pp. 190-203.

* cited by examiner

*Primary Examiner*—Dao H Nguyen

(57) ABSTRACT

A semiconductor device suitable for applications in an electrostatic discharge (ESD) protection circuit, including a semiconductor substrate, a first well formed in the substrate, a second well formed in the substrate, and a first doped region formed in the second well, wherein the first well, the second well, and the first doped region collectively form a parasitic bipolar junction transistor (BJT), and wherein the first well is the collector of the BJT, the second well is the base of the BJT, and the first doped region is the emitter of the BJT.

29 Claims, 14 Drawing Sheets

TURN-ON-EFFICIENT BIPOLAR STRUCTURES FOR ON-CHIP ESD PROTECTION

CROSS-REFERENCE TO RELATED APPLICATIONS

This is a Continuation Patent Application of U.S. patent application Ser. No. 10/727,550, filed Dec. 5, 2003, now U.S. Pat. No. 7,244,992 which claims the benefit of U.S Provisional Patent Application No. 60/487,581, filed Jul. 17, 2003.

DESCRIPTION OF THE INVENTION

1. Field of the Invention

This invention is related to semiconductor devices used for providing electrostatic discharge (ESD) protection and, more particularly, to semiconductor devices having bipolar structures for ESD protection.

2. Background of the Invention

A semiconductor integrated circuit (IC) is generally susceptible to an electrostatic discharge (ESD) event, which refers to a phenomenon of electrical discharge of a current (positive or negative) for a short duration during which a large amount of current is provided to the IC. An ESD event may damage or destroy the IC, and protection against the ESD is necessary for the IC. A conventional scheme for ESD protection incorporates a substrate-triggered ESD protection device.

FIG. 1 shows an IC 10 that includes an ESD protection circuit 100 for protecting IC 10 against ESD events. FIG. 2 is the cross-sectional view of ESD protection circuit 100. As shown in FIG. 1, IC 10 includes a contact pad 12 coupled to an internal circuit 14 through a driver circuit 16. Driver circuit 16 comprises a PMOS transistor 18 and an NMOS transistor 20. Each of PMOS transistor 18 and NMOS transistors 20 includes a source, a drain, and a gate. The source of PMOS transistor 18 is coupled to a positive power Supply $V_{DD}$. The source of NMOS transistor 20 is coupled to ground or a negative power supply $V_{SS}$. Both the gates of PMOS transistor 18 and NMOS transistor 20 are coupled to contact pad 12. Both the drains of PMOS transistor 18 and NMOS transistor 20 are coupled to internal circuit 14.

ESD protection circuit 100 is coupled to contact pad 12 to detect an ESD event and protect IC 10 against the ESD. As shown in FIG. 1, ESD protection circuit 100 comprises NMOS transistors 102 and 104 and a resistor 106. Each of NMOS transistors 102 and 104 includes a substrate, a source, a drain, and a gate. The source of NMOS transistor 102 and the substrates of both NMOS transistors 102 and 104 are all coupled to one another, and are further coupled to one end of resistor 106. The gates of both NMOS transistors 102 and 104, the source of NMOS transistor 104, and the other end of resistor 106 are all coupled to $V_{SS}$. The drains of NMOS transistors 102 and 104 are both Coupled to contact pad 12 and driver circuit 16.

Also shown in FIG. 1 is a bipolar junction transistor (BJT) 108 parasitic to NMOS transistor 104, wherein the substrate of NMOS transistor 104 is the base of BJT 108, and the source and the drain of NMOS transistor 104 are the emitter and collector of BJT 108.

In operation, when a positive ESD appears on contact pad 12, a positive potential appears on the drain of NMOS transistor 102, creating a high reverse bias across the junction between the drain and the substrate of NMOS transistor 102. The reverse bias across the drain-substrate junction of NMOS transistor 102 generates a current through ion implantation, which flows through the substrate of NMOS transistor 102 and resistor 106. As a result, the potential at the substrate of NMOS transistor 104, or the base of BJT 108, is increased, the base-emitter junction of BJT 108 is forward-biased, and BJT 108 is turned on to conduct the ESD to ground $V_{SS}$.

FIG. 2 is the cross-sectional view of an ESD protection circuit 200 manufactured in a p-type semiconductor substrate 202. ESD protection circuit 200 includes two ESD protection circuits 100 for protecting IC 10 against an ESD event. Each ESD protection circuit 100 includes NMOS transistors 102 and 104 and resistor 106, wherein each of NMOS transistors 104 includes a parasitic BJT 108. Semiconductor substrate 202 includes n-wells 204, 206, and 208, formed spaced apart from one another. The drain (not numbered) of one of NMOS transistors 108 is formed in n-well 204, the drain (not numbered) of the other NMOS transistor 108 is formed in n-well 208, and portions of the drains (not numbered) of both NMOS transistors 102 are formed in n-well 206. As indicated by the dashed lines in FIG. 2, resistors 106 are realized as the parasitic resistance of semiconductor substrate 202.

In addition, semiconductor substrate 202 has formed therein a plurality of diffusion regions, including $P^+$ regions 210, 212, 214, 216, and an $N^+$ region 218. $P^+$ regions 210 and 212 are formed in substrate 202 and isolated from n-wells 204 and 208 by shallow trench insulations (STIs) 220 and 222, respectively. $P^+$ regions 214 and 216 are formed in substrate 202, and each of $P^+$ regions 214 and 216 is adjacent to the source of a respective one of NMOS transistors 102. $P^+$ region 214 is isolated from the source of one of the NMOS transistors 104 by STI 224, and $P^+$ region 216 is isolated from the source of the other NMOS transistors 104 by STI 226. $N^+$ region 218 is formed in n-well 206 and isolated from the drains of NMOS transistors 102 by STIs 228 and 230.

Referring to FIG. 2, contact pad 12 is coupled to the drains of NMOS transistor 104, and also coupled to the drains of NMOS transistors 102 through $N^+$ region 218 and n-well 206. The gates of NMOS transistors 102 and 104, the sources of NMOS transistors 104, and $P^+$ regions 210 and 212 are all coupled to ground, or $V_{SS}$.

In an ESD event, the ESD is received at $N^+$ region 218 and is coupled to the drain of NMOS transistors 102 through n-well 206. A current due to ion implantation is generated through NMOS transistors 102, and flows to ground $V_{SS}$ through resistors 106 and $P^+$ regions 210 and 212. As a result, the potential at the bases of BJTs 108 is increased to positive with respect to the emitters of BJTs 108. BJTs 108 are thus turned on to conduct the ESD to ground. Because the current through substrate 202, resistors 106, and $P^+$ regions 210 and 212 triggers BJTs 108 to conduct the ESD, the current is also referred to as a trigger current.

SUMMARY OF THE INVENTION

In accordance with the present invention, there is provided a semiconductor device suitable for applications in an electrostatic discharge (ESD) protection circuit, including a semiconductor substrate, a first well formed in the substrate, a second well formed in the substrate, and a first doped region formed in the second well, wherein the first well, the second well, and the first doped region collectively form a parasitic bipolar junction transistor (BJT), and wherein the first well is the collector of the BJT, the second well is the base of the BJT, and the first doped region is the emitter of the BJT.

Also in accordance with the present invention, there is provided a semiconductor device suitable for applications in an electrostatic discharge (ESD) protection circuit, including a semiconductor substrate, a first well formed in the substrate, a second well formed in the substrate, a third well formed in the substrate, and a first doped region formed in the second well, wherein the first well, the second well, and the first doped region collectively form a first parasitic bipolar junction transistor (BJT), and wherein the second well, the third well, and the first doped region collectively form a second parasitic BJT, and wherein the first well is the collector of the first BJT, the third well is the collector of the second BJT, the second well is the base of both of the first and the second BJTs, and the first doped region is the emitter of both of the first and the second BJTs.

Further in accordance with the present invention, there is provided a semiconductor device suitable for applications in an electrostatic discharge (ESD) protection circuit, including a semiconductor substrate, a first well formed in the substrate, a second well formed in the substrate, a third well formed in the substrate, a first doped region formed in the second well, and a second doped region formed in the second well, wherein the first well, the second well, and the first doped region collectively form a first parasitic bipolar junction transistor (BJT), and the second well, the third well, and the second doped region collectively form a second parasitic BJT, and wherein the first well is the emitter of the first BJT, the third well is the emitter of the second BJT, the second well is the base of both of the first and the second BJTs, the first doped region is the collector the first BJT, and the second doped region is the collector of the second BJT.

Still in accordance with the present invention, there is provided a method of providing electrostatic discharge (ESD) protections, including providing a semiconductor substrate, providing a first well in the substrate, providing a second well in the substrate, providing a first doped region in the second well, providing a second doped region in the substrate for receiving an ESD in an ESD event, wherein the second doped region is a contact to the first well, providing a third doped region in the substrate, and providing an ESD detection circuit for detecting the ESD, wherein the first well, the second well, and the first doped region are configured to form a parasitic bipolar junction transistor (BJT), and wherein the ESD detection circuit provides a trigger current or trigger voltage to the third doped region, which triggers the BJT to discharge the ESD.

Still further in accordance with the present invention, there is provided a method of providing electrostatic discharge (ESD) protections, including providing a semiconductor substrate, providing a first parasitic bipolar junction transistor (BJT) in the substrate, wherein the first BJT has an emitter, a collector, and a base, wherein the collector of the first BJT is coupled to receive an ESD in an ESD event, providing a second BJT in the substrate, wherein the second BJT has an emitter, a collector, and a base, wherein the collector of the BJT is coupled to receive the ESD, and providing an ESD detection circuit for detecting the ESD, wherein the ESD detection circuit provides a trigger current or trigger voltage in the ESD event to turn on the first BJT and the second BJT to discharge the ESD, wherein a well formed in the substrate is the base of both the first BJT and the second BJT, and the first BJT and the second BJT are triggered in the ESD event by the trigger current flowing through the well.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Figure 1:
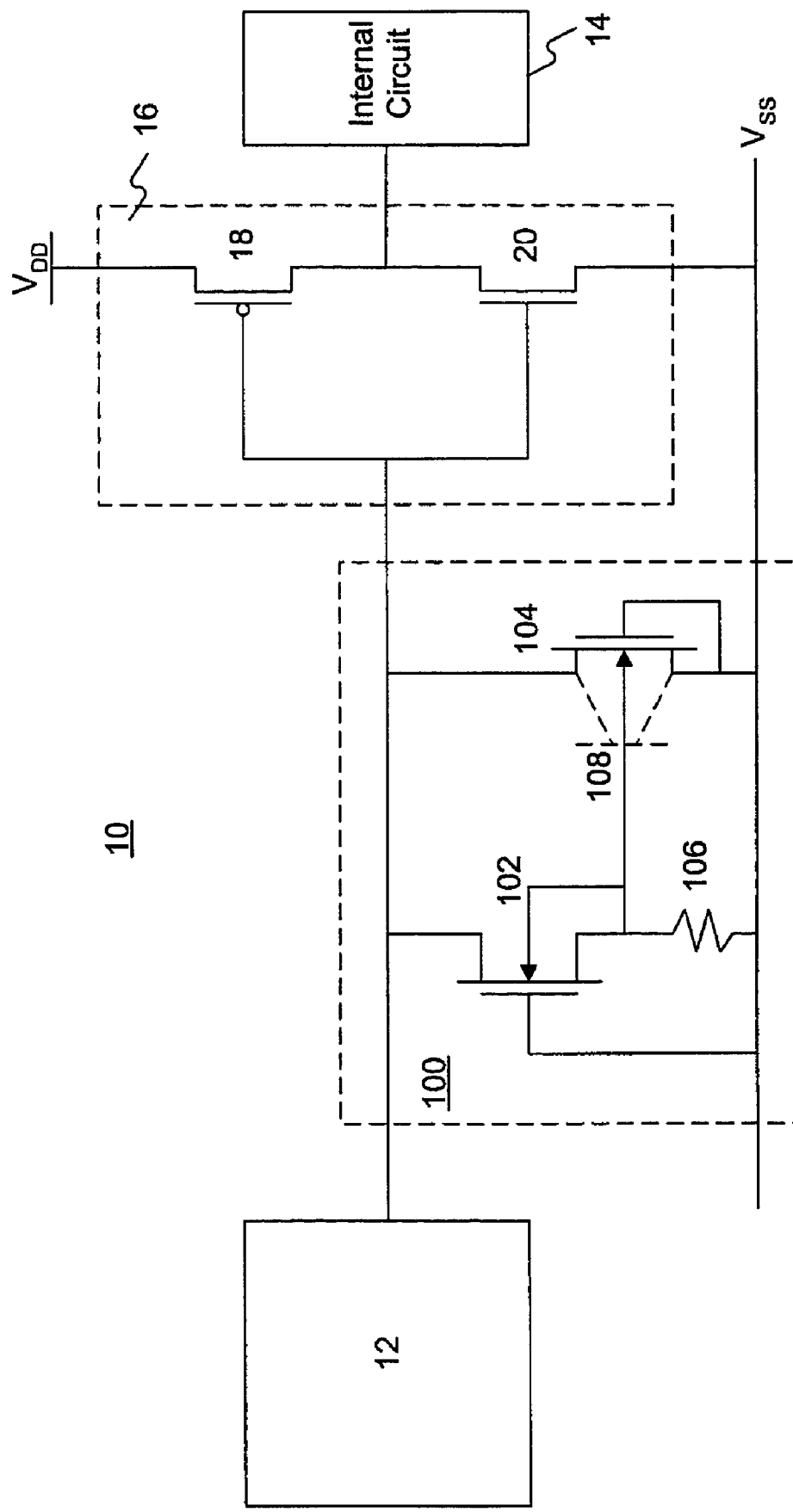
FIG. 1 is a circuit diagram of a conventional electrostatic discharge (ESD) protection circuit.
Figure 2:
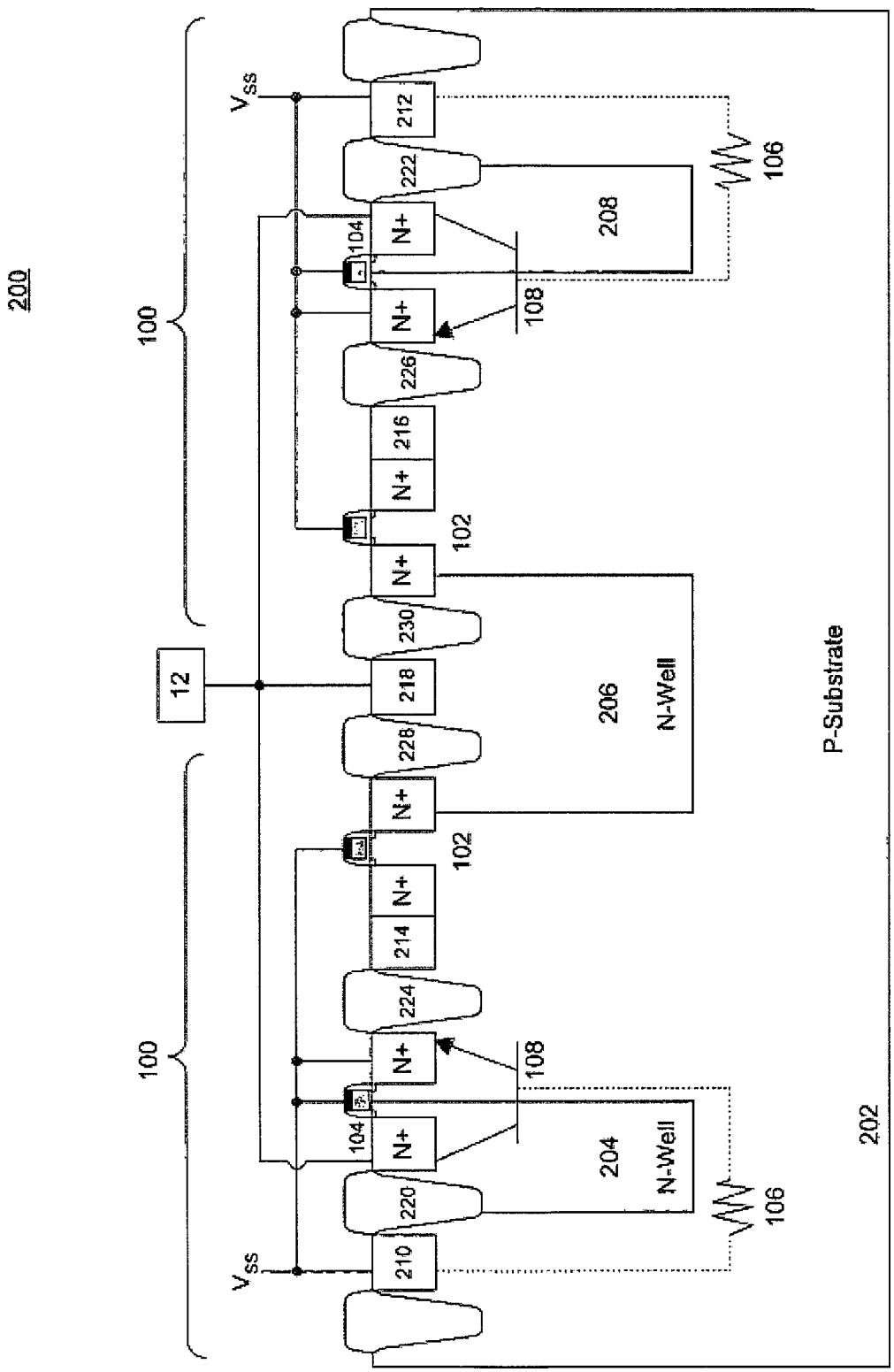
FIG. 2 is the cross-sectional view of the ESD protection circuit shown in FIG. 1.
Figure 3:
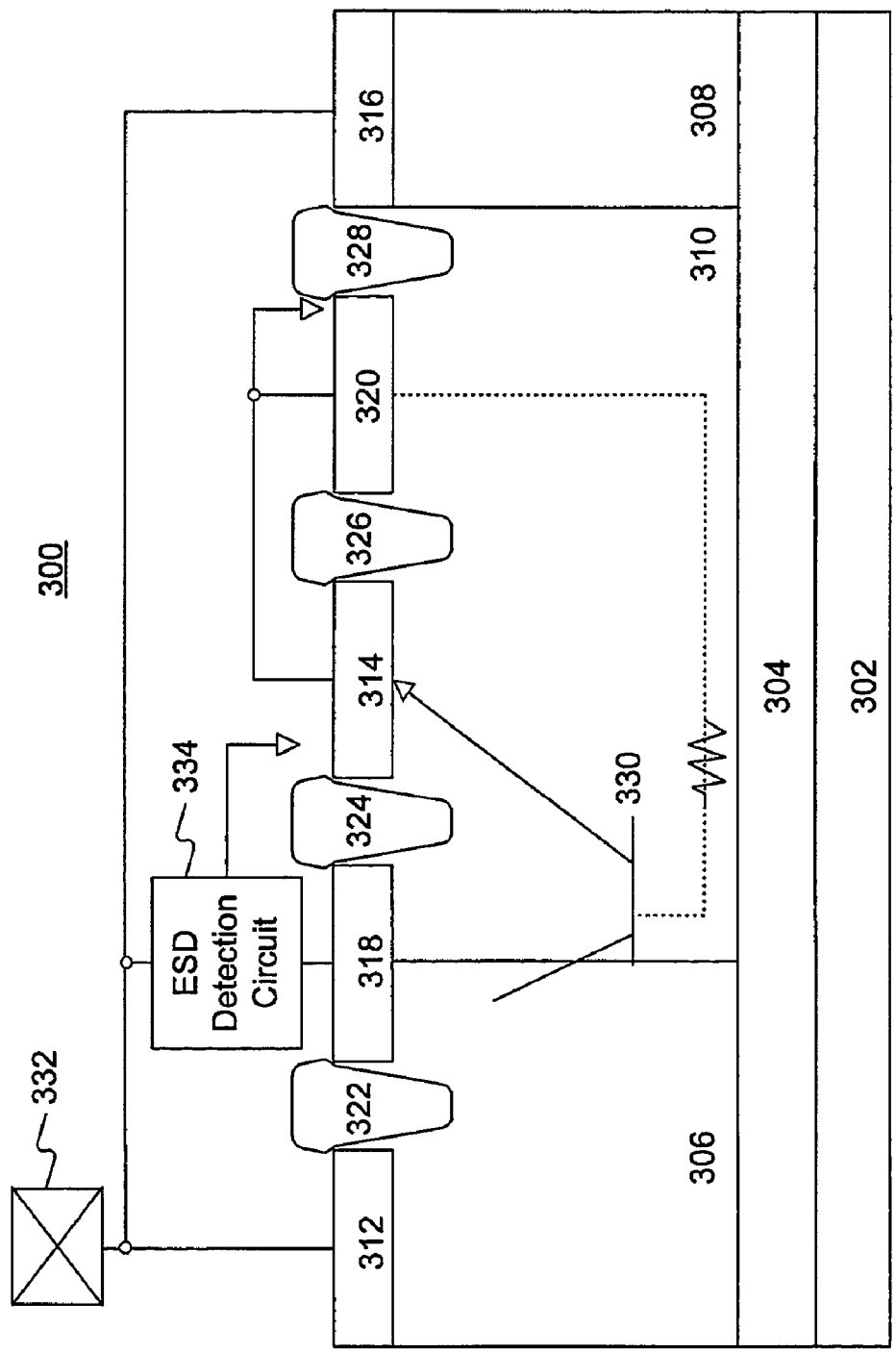
FIG. 3 is the cross-sectional view of a bipolar device suitable for providing ESD protections consistent with one embodiment of the present invention.

FIG. 3 is the cross-sectional view a substrate-triggered bipolar device 300 consistent with one embodiment of the present invention. Referring to FIG. 3, bipolar device 300 includes a substrate 302. Substrate 302 includes a plurality of N-wells 304, 306, and 308, and a P-well 310, wherein N-well 304 is formed deep in substrate 302 and isolates substrate 302 from N-wells 306 and 308 and P-well 310. P-well 310 is formed adjacent to N-well 306, and N-well 308 is formed adjacent to P-well 310. Also formed in substrate 302 are a plurality of diffusion regions, including $N^+$ regions 312, 314, and 316, and $P^+$ regions 318 and 320, wherein $N^+$ region 312 is formed in N-well 306, N+ region 314 is formed in P-well 310, N+ region 316 is formed in N-well 308, and P+ region 320 is formed in P-well 310. P+ region 318 is formed in both N-well 306 and P-well 310, i.e., a portion of P+ region 316 is formed in N-well 306, and another portion of P+ region 316 is formed in P-well 310. Hereinafter, when a diffusion region is described as having one portion formed in a first well and another portion formed in a second well, the diffusion region is described as having been formed in both the first well and the second well.

Diffusion regions 312, 314, 316, 318, and 320 are electrically isolated from each other by a plurality of isolation regions 322, 324, 326, and 328. Isolation region 322 electrically isolates N+ region 312 from P+ region 318; isolation region 324 electrically isolates P+ region 318 from N+ region 314; isolation region 326 electrically isolates N+ region 314 from P+ region 320; and isolation region 328 electrically isolates P+ region 320 from N+ region 316. In one aspect, isolation regions 322, 324, 326, and 328 are shallow trench isolations (STIs). In another aspect, isolation regions 322, 324, 326, and 328 are local oxidation of silicon (LOCOS) regions.

Also shown in FIG. 3 is a parasitic NPN bipolar junction transistor (BJT) 330 formed collectively by N-well 306, P-well 310, and N+ region 314, wherein N-well 306 is the collector of BJT 330, P-well 310 is the base of BJT 330, and N+ region 314 is the emitter of BJT 330. N+ region 312 is the contact to N-well 306, or the collector of BJT 330, and P+ region 318 is a contact to P-well 310, or the base of BJT 330. P+ region 320 is also a contact to P-well 310, but is spaced apart from P+ region 318.

In an exemplary application of bipolar device 300, N+ region 312 is coupled to a contact pad 332 to receive an electrostatic discharge (ESD) current in an ESD event, and N+ region 314 and P+ region 320 are both grounded. An ESD detection circuit 334 is coupled between contact pad 332 and P+ region 318 to detect the ESD. One terminal (not numbered) of ESD detection circuit 334 is grounded. N+ region 316 is also coupled to contact pad 332. ESD detection circuit 334 may be implemented with any known ESD detection scheme and the details of which will not be described herein.

For illustration purposes, in the following descriptions of the embodiments of the present application, an ESD current flowing from the contact pad, such as contact pad 332, into the bipolar device, such as 300, is referred to as a positive ESD current, and an ESD current flowing from the bipolar device to the contact pad is referred to as a negative ESD current.

In operation, when a positive ESD current is received at contact pad 332, ESD detection circuit 334 detects the ESD and provides a trigger current to P+ region 318. The trigger current flows through P-well 310 to P+ region 320. The trigger current generates a positive potential due to the non-zero parasitic resistance of P-well 310 from P+ region 318 to P+ region 320 and triggers, or turns on, BJT 330 to conduct the positive ESD current from N+ region 312 to N+ region 314, which, in turn, is coupled to ground.

Referring again to FIG. 3, since a portion of P+ region 318 is formed in N-well 306, N-well 306 and N+ region 314 are formed close to each other. As a result, the effective base width of BJT 330, which is approximately the distance between N-well 306 and N+ region 314, is reduced to a minimum. Therefore, the gain of BJT 330 is increased and a turn-on speed of BJT 330 is improved.

Figure 4:
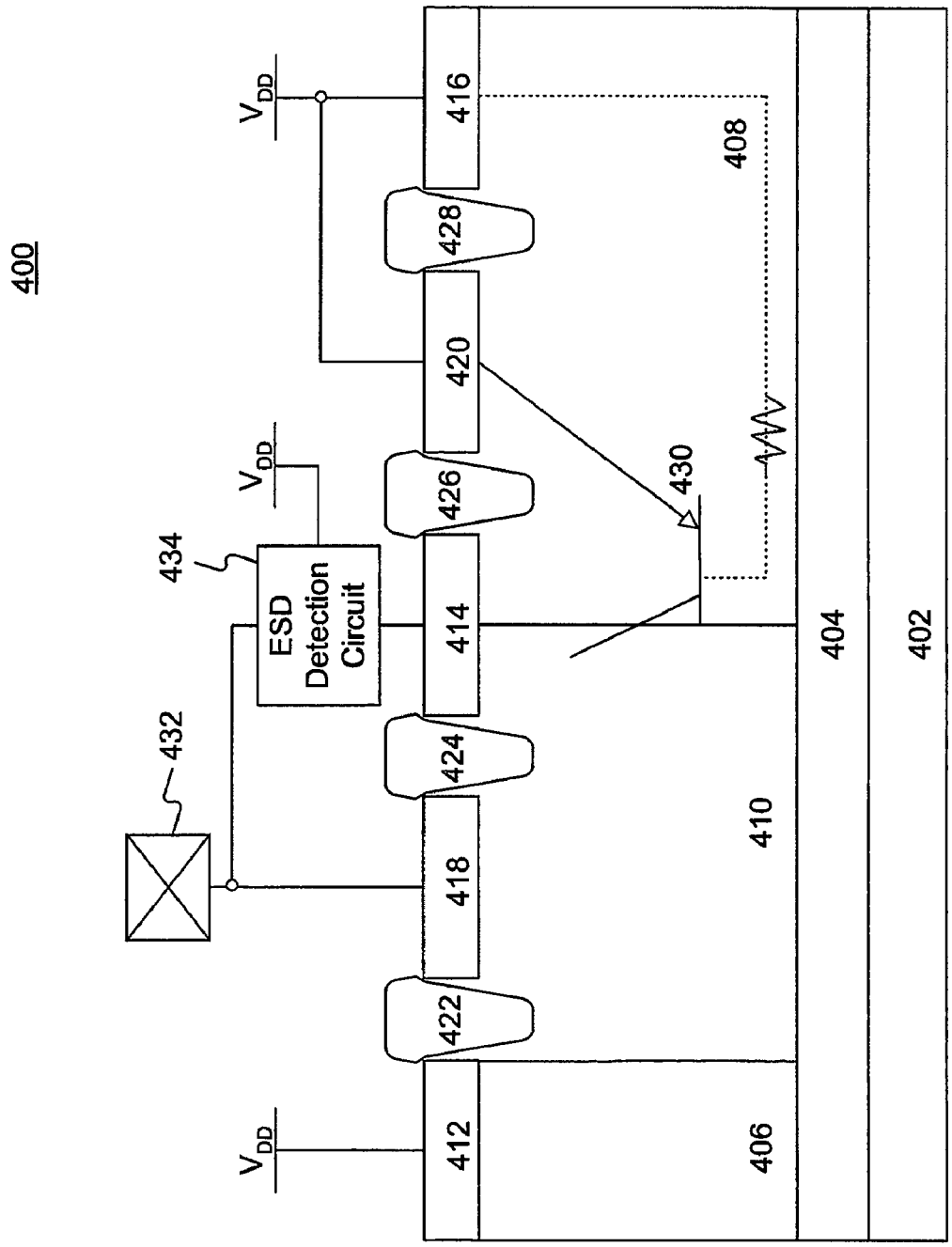
FIG. 4 is the cross-sectional view of a bipolar device suitable for providing ESD protections consistent with another embodiment of the present invention.

As discussed above, bipolar device 300 as shown in FIG. 3 includes an NPN BJT for discharging an ESD. According to another embodiment of the present invention, there is also provided a substrate-triggered bipolar device including a PNP BJT suitable for providing ESD protection. FIG. 4 shows the cross-sectional view of such a bipolar device 400 consistent with the second embodiment of the present invention.

Referring to FIG. 4, bipolar device 400 includes a substrate 402. A plurality of N-wells 404, 406, and 408, and a P-well 410 are formed in substrate 402, wherein N-well 404 is formed deep in substrate 402 and isolates substrate 402 from N-wells 406 and 408 and P-well 410. P-well 410 is formed adjacent to N-well 406, and N-well 408 is formed adjacent to P-well 410. Also formed in substrate 402 are a plurality of diffusion regions, including N+ regions 412, 414, and 416, and P+ regions 418 and 420, wherein N+ region 412 is formed in N-well 406, N+ region 416 is formed in N-well 408, P+ region 418 is formed in P-well 410, P+ region 420 is formed in N-well 408, and N+ region 414 is formed in both N-well 408 and P-well 410.

Diffusion regions 412, 414, 416, 418, and 420 are electrically isolated from each other by a plurality of isolation regions 422, 424, 426, and 428. Isolation region 422 electrically isolates N+ region 412 from P+ region 418; isolation region 424 electrically isolates P+ region 418 from N+ region 414; isolation region 426 electrically isolates N+ region 414 from P+ region 420; and isolation region 428 electrically isolates P+ region 420 from P+ region 416. In one aspect, isolation regions 422, 424, 426, and 428 are STIs. In another aspect, isolation regions 422, 424, 426, and 428 are LOCOS.

P-well 410, N-well 408, and P+ region 420 collectively form a parasitic PNP BJT 430, wherein P-well 410 is the collector of BJT 430, N-well 408 is the base of BJT 430, and P+ region 420 is the emitter of BJT 430. P+ region 418 is the contact to P-well 410, or the collector of BJT 430, and N+ region 414 is a contact to N-well 408, or the base of BJT 430. N+ region 416 is also a contact to N-well 408, but is spaced apart from N+ region 414.

In an exemplary application of bipolar device 400, P+ region 418 is coupled to a contact pad 432 to receive an, ESD current in an ESD event, and N+ regions 412 and 416 and P+ region 420 are all connected to a positive power supply $V_{DD}$. An ESD detection circuit 434 is coupled between contact pad 432 and N+ region 414 to detect the ESD. A terminal of ESD detection circuit 434 is also connected to $V_{DD}$.

In an ESD event, when a negative ESD current appears on contact pad 432, ESD detection circuit 434 detects the ESD and generates a trigger current from N+ region 414. The trigger current flows through N-well 408 from N+ region 416, which is connected to $V_{DD}$, to N+ region 414. Because of the non-zero parasitic resistance of N-well 408, the potential near N+ region 414 is lowered to a relative negative value with respect to $V_{DD}$. As a result, BJT 430 is triggered, or turned on, to conduct the negative ESD current from P+ region 418 to P+ region 420, which, in turn, is connected to positive power supply $V_{DD}$.

In one aspect, since a portion of N+ region 414 is formed in P-well 410, P-well 410 and P+ region 420 are formed close to each other. In other words, the effective base width of BJT 430 is very small and, therefore, the turn-on speed of BJT 430 is improved.

Figure 5:
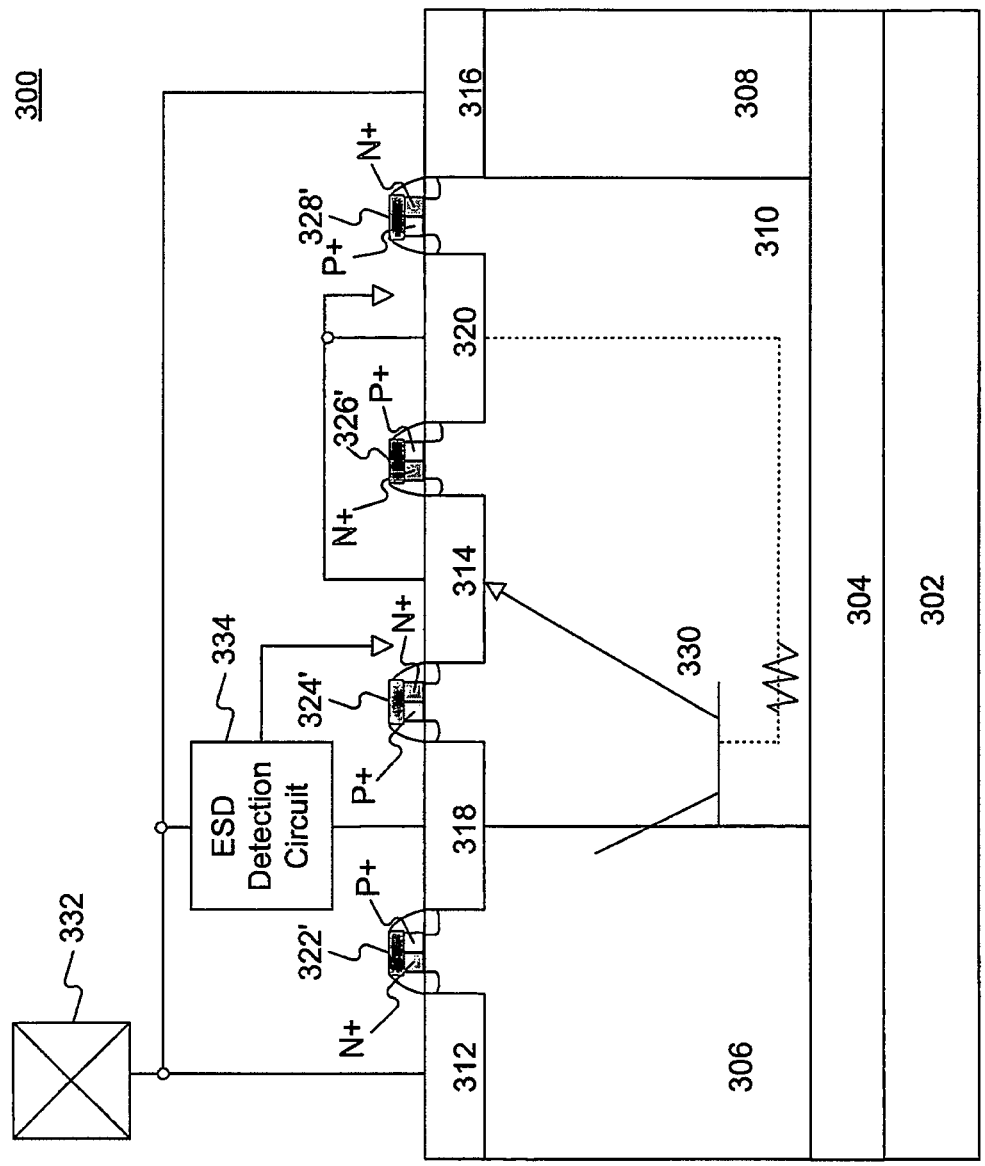
FIG. 5 is the cross-sectional view of another bipolar device suitable for providing ESD protections also consistent with the embodiment shown in FIG. 3.
Figure 6:
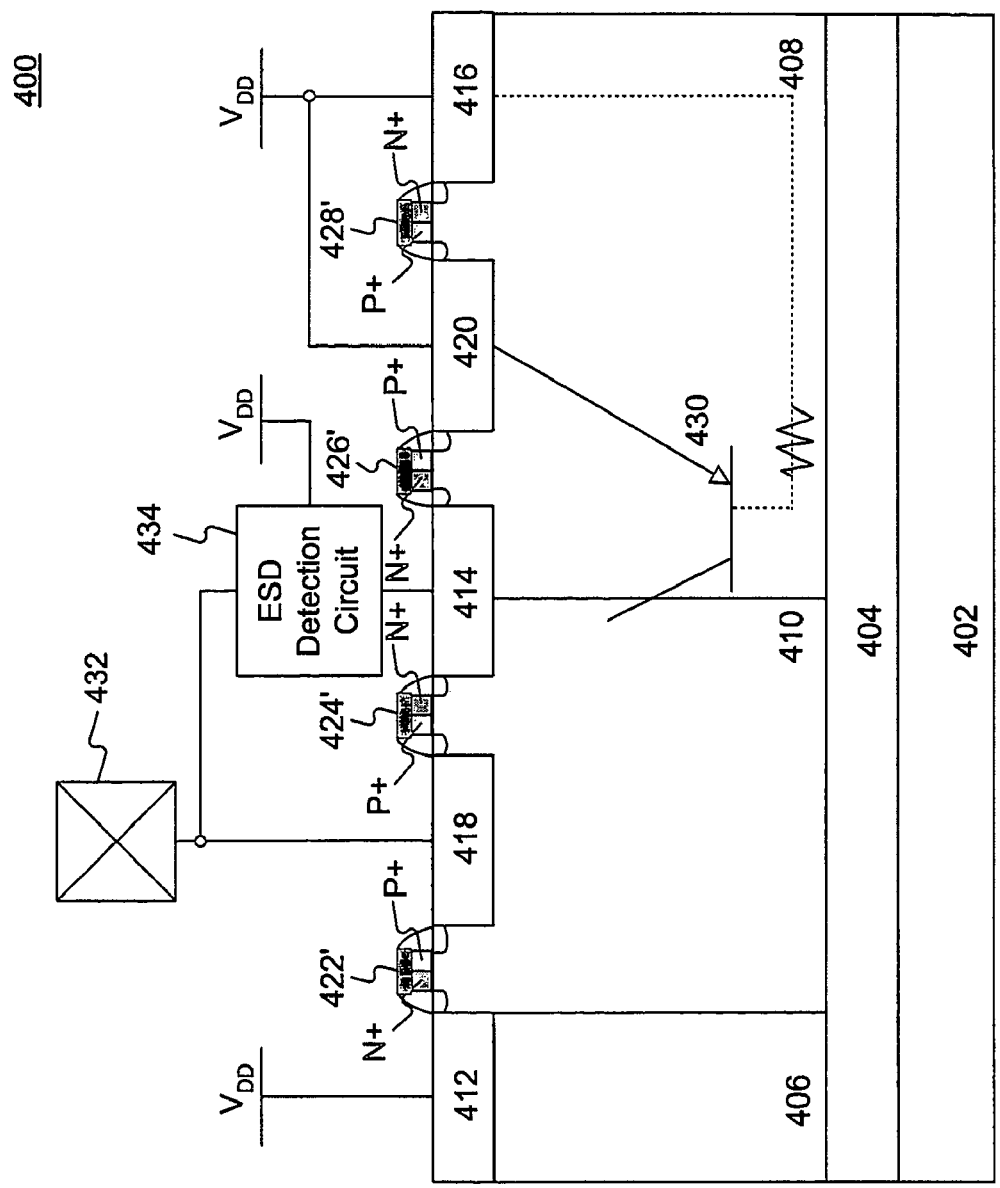
FIG. 6 is the cross-sectional view of another bipolar device suitable for providing ESD protections also consistent with the embodiment shown in FIG. 4.

Also according to the present invention, the isolation regions in the first and second embodiments described above may be replaced with dummy gates, thereby further reducing the dimension of the bipolar device. FIGS. 5 and 6 respectively show the realization of bipolar devices 300 and 400 with dummy gates.

Referring to FIG. 5, isolation regions 322, 324, 326, and 328 of bipolar device 300 are replaced with dummy gate structures 322', 324', 326', and 328', respectively, without modifying the remaining structures. Referring to FIG. 6, isolation regions 422, 424, 426, and 428 of bipolar device 400 are replaced with dummy gate structures 422', 424', 426', and 428', respectively, without modifying the remaining structures, As shown in FIGS. 5 and 6, the gates of these dummy gate structures are doped with both $P^+$ and $N^+$ dopants, wherein a portion of the gates proximate a $P^+$ region is doped with $P^+$ dopant, and a portion of the gates proximate an $N^+$ region is doped with $N^+$ dopant. Because a dummy gate has a substantially smaller size than an STI or LOGOS isolation, the configurations as shown in FIGS. 5 and 6 need a substantially smaller chip area than those show in FIGS. 3 and 4.

Figure 7:
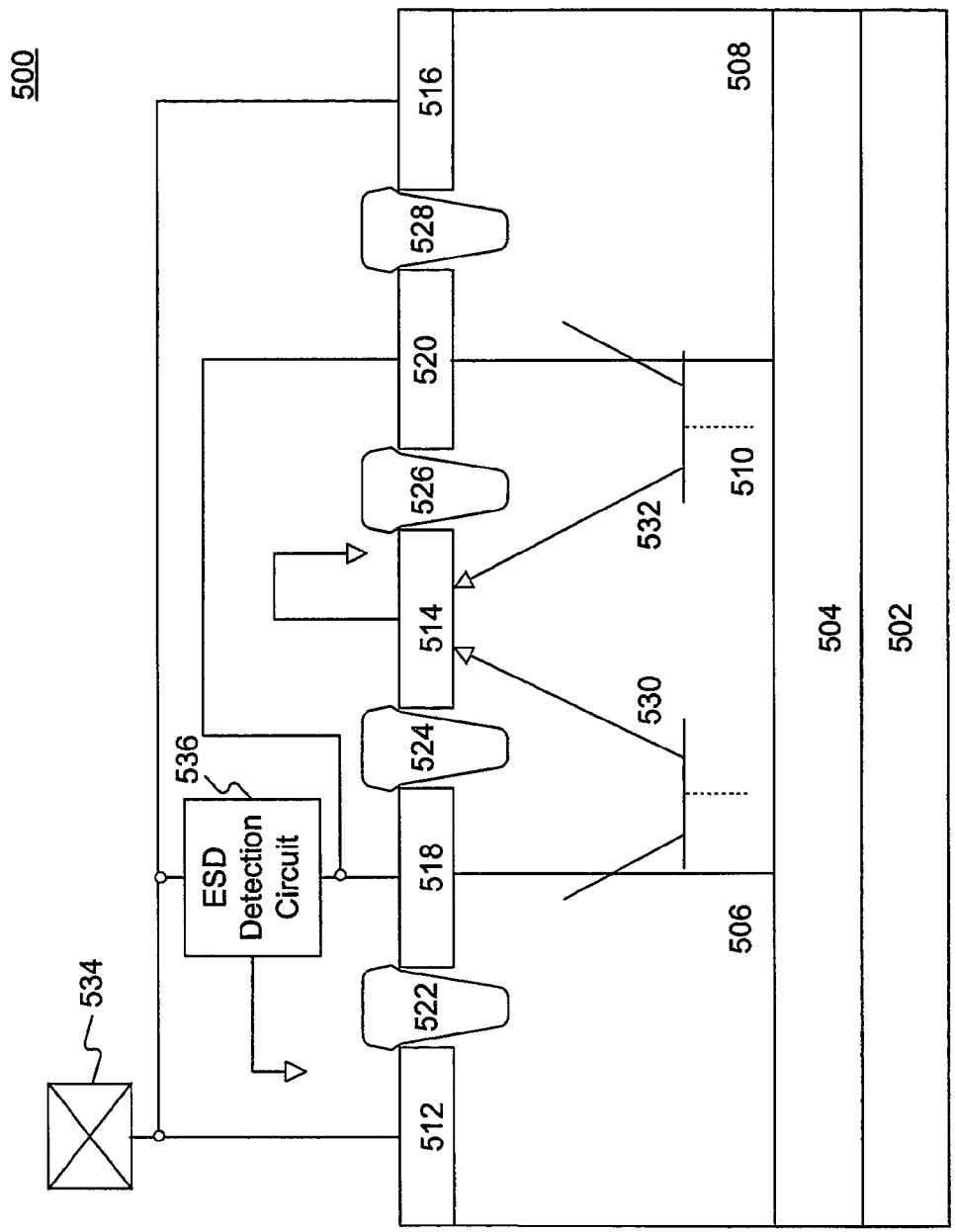
FIG. 7 is the cross-sectional view of a bipolar device suitable for providing ESD protections consistent with yet another embodiment of the present invention.

According to the present invention, there is also provided a floating-base bipolar device suitable for providing ESD protection. FIG. 7 shows a floating-base bipolar device 500 including parasitic NPN BJTs consistent with a third embodiment of the present invention.

Referring to FIG. 7, bipolar device 500 is formed in a semiconductor substrate 502. A plurality of N-wells 504, 506, and 508, and a P-well 510 are formed in substrate 502, wherein N-well 504 is formed deep in substrate 502 and isolates substrate 502 from N-wells 506 and 508 and P-well 510. P-well 510 is formed adjacent to N-well 506, and N-well 508 is formed adjacent to P-well 510. A plurality of diffusion regions, including $N^+$ regions 512, 514, and 516, and $P^+$ regions 518 and 520 are formed in substrate 502, wherein $N^+$ region 512 is formed in N-well 506, $N^+$ region 514 is formed in P-well 510, $N^+$ region 516 is formed in N-well 508, $P^+$ region 518 is formed in both N-well 506 and P-well 510, and $P^+$ region 520 is formed in both P-well 510 and N-well 508.

Diffusion regions 512, 514, 516, 518, and 520 are electrically isolated from each other by a plurality of isolation regions 522, 524, 526, and 528. Isolation region 522 electrically isolates $N^+$ region 512 from $P^+$ region 51.8; isolation region 524 electrically isolates $P^+$ region 518 from $N^+$ region 514; isolation region 526 electrically isolates $N^+$ region 514 from $P^+$ region 520; and isolation region 528 electrically isolates $P^+$ region 520 from $N^+$ region 516. In one aspect, isolation regions 522, 524, 526, and 528 are STIs. In another aspect, isolation regions 522, 524, 526, and 528 are LOCOS.

As shown in FIG. 7, N-well 506, P-well 510, and $N^+$ region 514 collectively form a parasitic NPN BJT 530, and N-well 508, P-well 510, and $N^+$ region 514 collectively form a parasitic NPN BJT 532, wherein N-well 506 is the collector of BJT 530, N-well 508 is the collector of BJT 532, P-well 510 is the base of both BJT 530 and BJT 532, and $N^+$ region 514 is the emitter of both BJT 530 and BJT 532.

In an exemplary application of bipolar device 500, $N^+$ regions 512 and 516 are both coupled to a contact pad 534 to receive an ESD current in an ESD event, and $N^+$ region 514 is grounded. An ESD detection circuit 536 is coupled to contact pad 534 to detect the ESD, and both $P^+$ regions 518 and 520 are coupled to ESD detection circuit 536. A terminal (not numbered) of ESD detection circuit 536 is also grounded.

In the event that a positive ESD current appears on contact pad 534, ESD detection circuit 536 detects the ESD and generates a trigger current or a trigger voltage at $P^+$ regions 518 and 520 to turn on BJTs 530 and 532 to conduct the positive ESD current from $N^+$ regions 512 and 516 to $N^+$ region 514.

Figure 8:
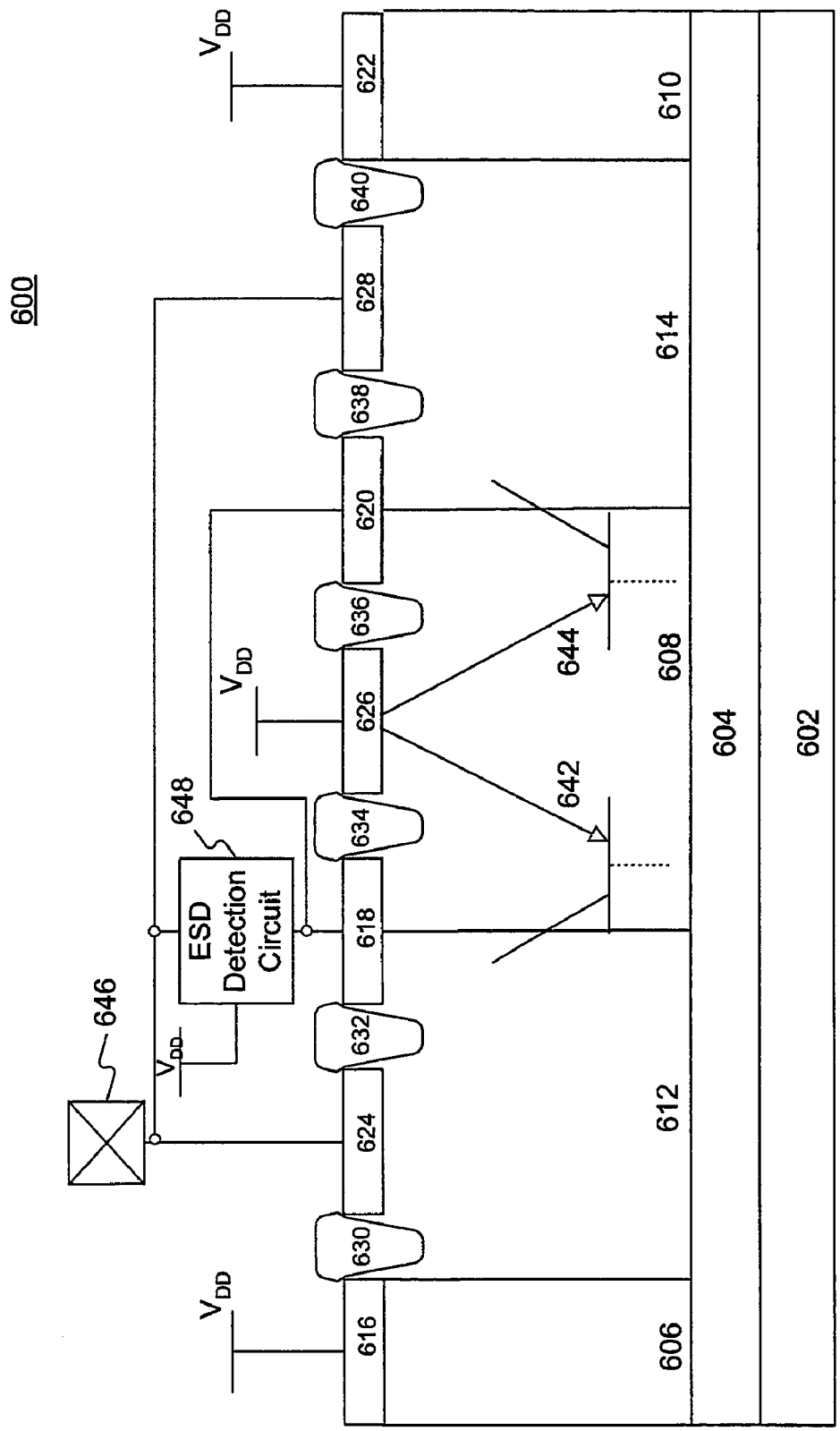
FIG. 8 is the cross-sectional view of a bipolar device suitable for providing ESD protections consistent still another embodiment of the present invention.

Consistent with a fourth embodiment of the present invention, there is also provided a floating-base bipolar device 600 including PNP BJTs for providing ESD protections. Referring to FIG. 8, bipolar device 600 is formed in a semiconductor substrate 602. A plurality of N-wells 604, 606, 608, and 610, and two P-wells 612 and 614 are formed in substrate 602, wherein N-well 604 is formed deep in substrate 602 and isolates substrate 602 from N-wells 606, 608, and 610 and P-wells 612 and 614. P-well 612 is formed adjacent to N-well 606, N-well 608 is formed adjacent to P-well 612, P-well 614 is formed adjacent to N-well 608, and N-well 610 is formed adjacent to P-well 614. A plurality of diffusion regions, including $N^+$ regions 616, 618, 620, and 622, and $P^+$ regions 624, 626, and 628 are also formed in substrate 602, wherein $N^+$ region 616 is formed in N-well 606, $N^+$ region 618 is formed in both P-well 612 and N-well 608, $N^+$ region 620 is formed in both N-well 608 and P-well 614, $N^+$ region 622 is formed in N-well 610, $P^+$ region 624 is formed in P-well 612, $P^+$ region 626 is formed in N-well 608, and $P^+$ region 628 is formed in P-well 614.

Diffusion regions 616, 618, 620, 622, 624, 626, and 628 are electrically isolated from each other by a plurality of isolation regions 630, 632, 634, 636, 638, and 640. Isolation region 630 electrically isolates $N^+$ region 616 from $P^+$ region 624; isolation region 632 electrically isolates $P^+$ region 624 from $N^+$ region 618; isolation region 634 electrically isolates $N^+$ region 618 from $P^+$ region 626; isolation region 636 electrically isolates $P^+$ region 626 from $N^+$ region 620; isolation region 638 electrically isolates $N^+$ region 620 from $P^+$ region 628; and isolation region 640 electrically isolates $P^+$ region 628 from $N^+$ region 622. In one aspect, isolation regions 630, 632, 634, 636, 638, and 640 are STIs. In another aspect, isolation regions 630, 632, 634, 636, 638, and 640 are LOCOS.

As shown in FIG. 8, P-well 612, N-well 608, and $P^+$ region 626 collectively form a parasitic PNP BJT 642, and P-well 614, N-well 608, and $P^+$ region 626 collectively form a parasitic PNP BJT 644, wherein P-well 612 is the collector of BJT 642, P-well 614 is the collector of BJT 644, N-well 608 is the base of both BJT 642 and BJT 644, and $P^+$ region 626 is the emitter of both BJT 642 and BJT 644.

In an exemplary application of bipolar device 600, $N^+$ regions 616 and 622 and $P^+$ region 626 are all connected to a positive power supply $V_{DD}$. $P^+$ regions 624 and 628 are both coupled to a contact pad 646 to receive an ESD in an ESD event. An ESD detection circuit 648 is coupled to contact pad 646 to detect the ESD, and both $N^+$ regions 618 and 620 are coupled to ESD detection circuit 648. A terminal (not numbered) of ESD detection circuit 648 is also connected to $V_{DD}$.

When a negative ESD current appears on contact pad 646, ESD detection circuit 648 detects the ESD and generates a trigger current or a trigger voltage at $N^+$ regions 618 and 620 to turn on BJTs 642 and 644 to conduct the negative ESD current from $P^+$ regions 624 and 628 to $P^+$ region 626, which, in turn, is coupled to a positive power supply.

Figure 9:
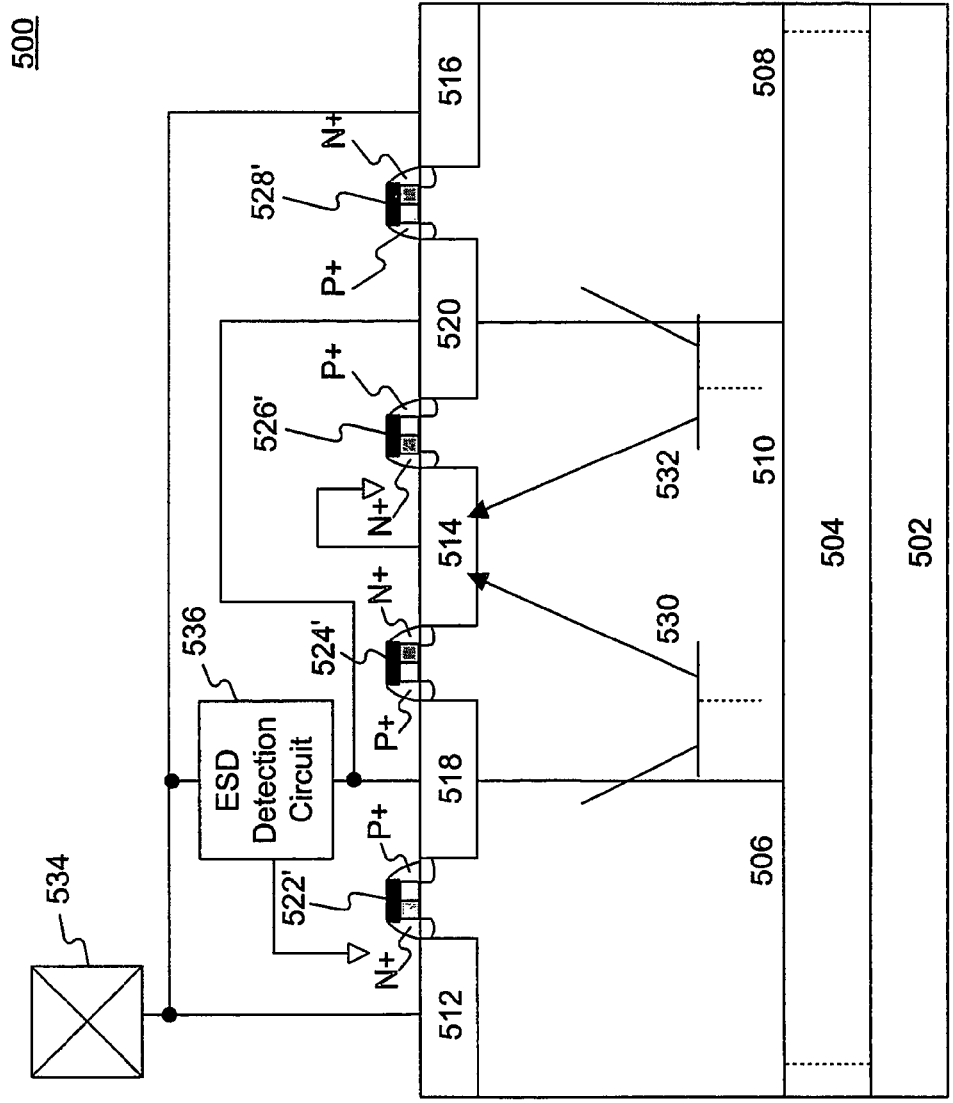
FIG. 9 is the cross-sectional view of another bipolar device suitable for providing ESD protections also consistent with the embodiment shown in FIG. 7.
Figure 10:
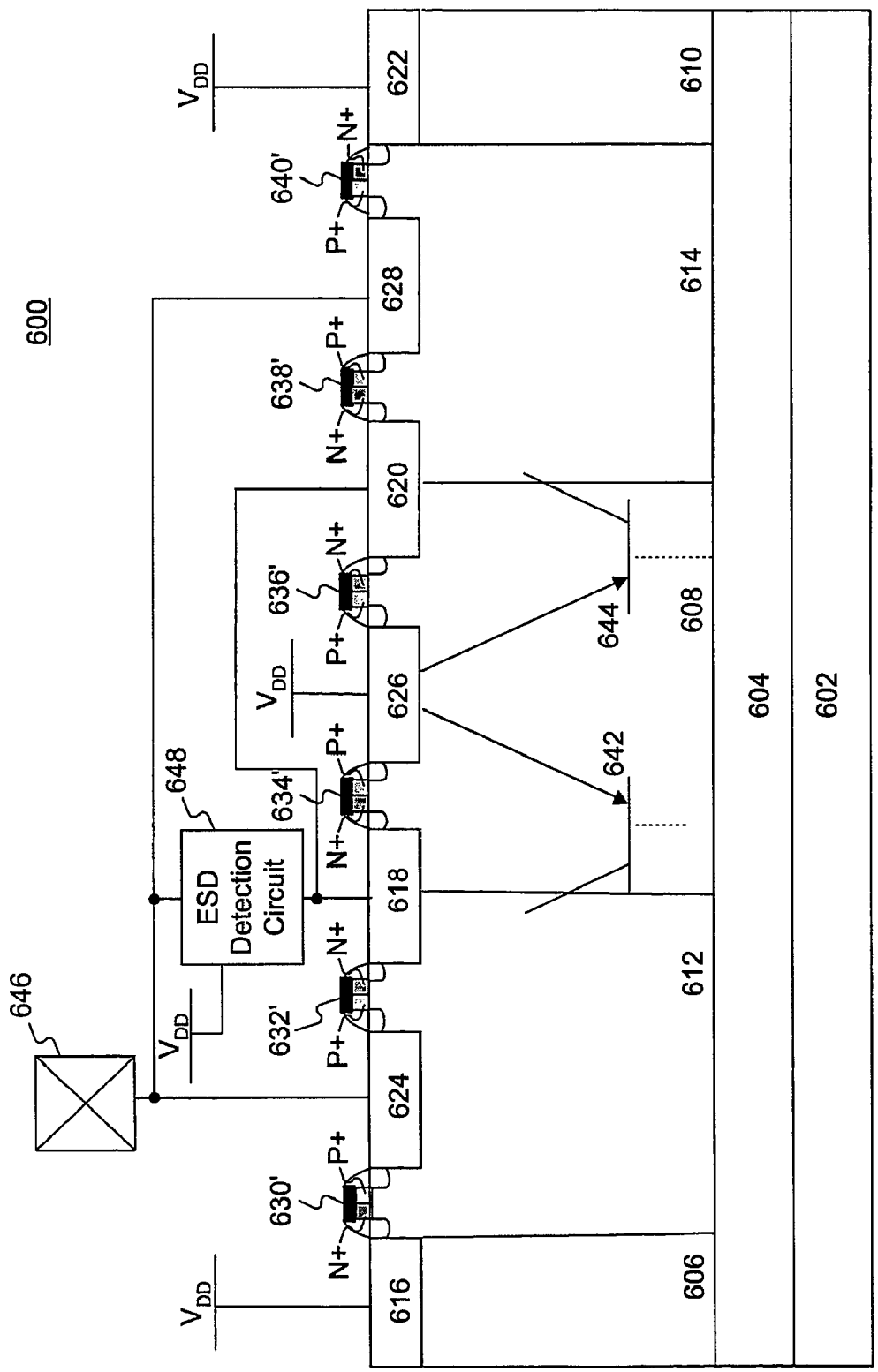
FIG. 10 is the cross-sectional view of another bipolar device suitable for providing ESD protections also consistent with the embodiment shown in FIG. 8.

Similarly, the isolation regions in the third and fourth embodiments may also be replaced with dummy gates to further reduce the dimension of the bipolar devices. FIGS. 9 and 10 respectively show the realization of bipolar devices 500 and 600 with dummy gates. Referring to FIG. 9, isolation regions 522, 524, 526, 528 of bipolar device 500 have been replaced with dummy gate structures 522', 524', 526', 528', respectively, without modifying the remaining structures. Referring to FIG. 10, isolation regions 630, 632, 634, 636, 638, and 640 of bipolar device 600 have been replaced with dummy gate structures 630', 632', 634', 636', 638', and 640', respectively, without modifying the rest of the structure. The gates of these dummy gate structures are doped with both $P^+$ and $N^+$ dopants, wherein a portion of the gates proximate a $P^+$ region is doped with $P^+$ dopant, and a portion of the gates proximate an $N^+$ region is doped with $N^+$ dopant, as shown in both FIGS. 9 and 10.

Figure 11:
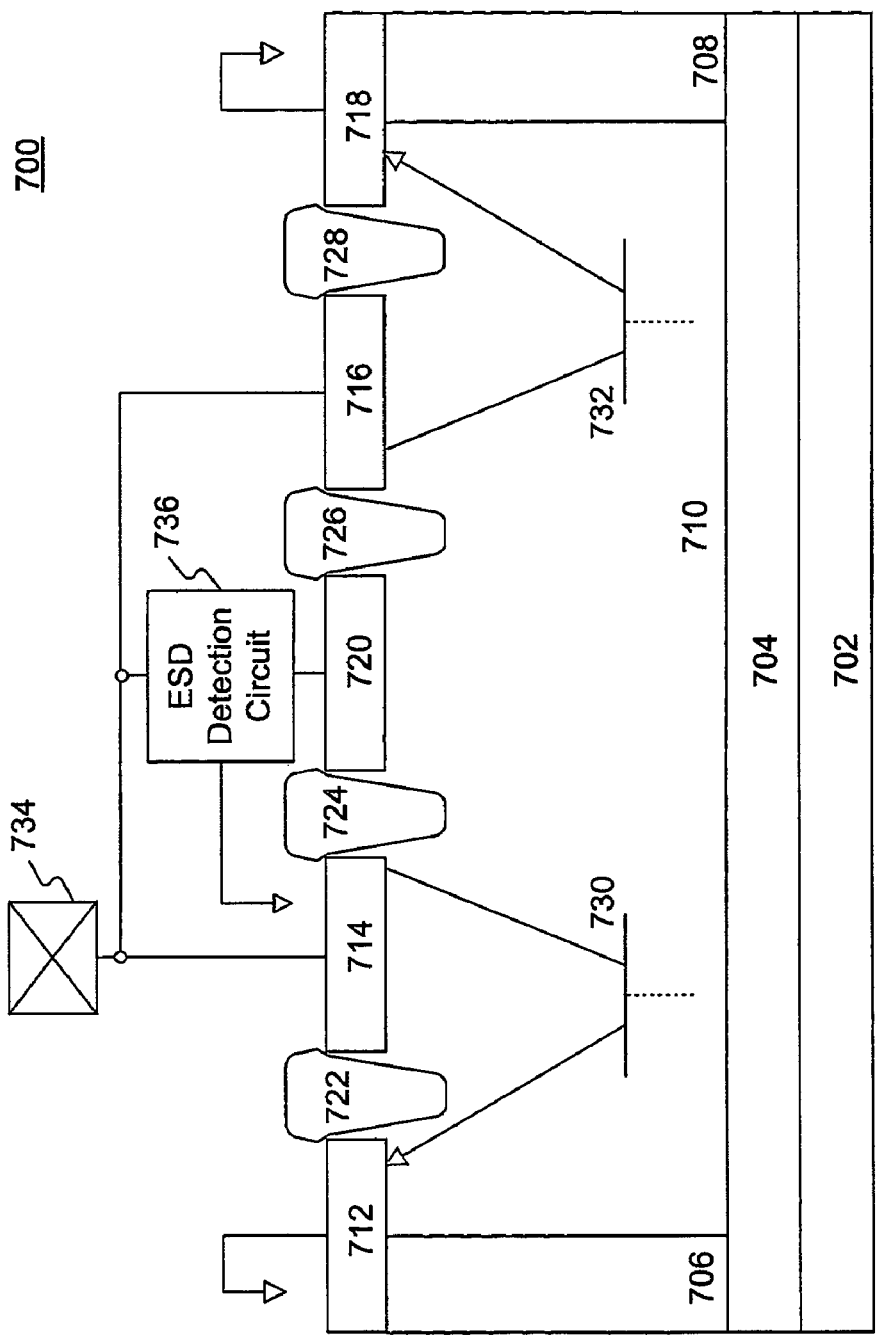
FIG. 11 is the cross-sectional view of a bipolar device suitable for providing ESD protections consistent with still yet another embodiment of the present invention.

Accord to the present invention, there is also provided a bipolar device for providing ESD protection, wherein the bipolar device has a large area for heat dissipation, and therefore device stability is improved. FIG. 11 shows a bipolar device 700 including NPN BJTs that have a large area for heat dissipation consistent, with a fifth embodiment of the present invention. Referring to FIG. 11, bipolar device 700 is formed in a semiconductor substrate 702. A plurality of N-wells 704, 706, and 708, and a P-well 710 are formed in substrate 702, wherein N-well 704 is formed deep in substrate 702 and separates substrate 702 from N-wells 706 and 708 and P-well 710. P-well 710 is formed adjacent to N-well 706, and N-well 708 is formed adjacent to P-well 710.

Also formed in substrate 702 are a plurality of diffusion regions, including $N^+$ regions 712, 714, 716, and 718, and a $P^+$ region 720, wherein $N^+$ region 712 is formed in both N-well 706 and P-well 710, $N^+$ regions 714 and 716 are formed in P-well 710, $N^+$ region 718 is formed in both N-well 708 and P-well 710, and $P^+$ region 720 is formed in P-well 710. Diffusion regions 712, 714, 716, 718, and 720 are electrically isolated from each other by a plurality of isolation regions 722, 724, 726, and 728. Isolation region 722 electrically isolates $N^+$ region 712 from $N^+$ region 714; isolation region 724 electrically isolates $N^+$ region 714 from $P^+$ region 720; isolation region 726 electrically isolates $P^+$ region 720 from $N^+$ regions 716; and isolation region 728 electrically isolates $N^+$ region 716 from $N^+$ region 718. In one aspect, isolation regions 722, 724, 726, and 728 are STIs. In another aspect, isolation regions 722, 724, 726, and 728 are LOCOS.

$N^+$ region 714, P-well 710, and N-well 706 collectively form a parasitic NPN BJT 730, and $N^+$ region 716, P-well 710, and $N^+$ region 718 collectively form a parasitic NPN BJT 732, wherein $N^+$ region 714 is the collector of BJT 730, $N^+$ region 716 is the collector of BJT 732, P-well 710 is the base of both BJTs 730 and 732, N-well 706 is the emitter of BJT 730, and N-well 708 is the emitter of BJT 732. $N^+$ region 712 is the contact to N-well 706, and $N^+$ region 718 is the contact to N-well 708.

In an exemplary application of bipolar device 700, $N^+$ regions 712 and 718 are grounded. $N^+$ regions 714 and 716 are coupled to a contact pad 734 to receive an ESD current in an ESD event. An ESD detection circuit 736 is coupled between contact pad 734 and $P^+$ region 720 to detect the ESD. A terminal (not numbered) of ESD detection circuit 736 is also grounded. When a positive ESD current appears on contact pad 734, ESD detection circuit 736 detects the ESD and generates a trigger current or a trigger voltage at $P^+$ region 720, thereby turning on BJTs 730 and 732 to conduct the ESD from $N^+$ regions 714 and 716 to $N^+$ regions 712 and 718, respectively.

As shown in FIG. 11, the emitters of BJTs 730 and 732 are N-wells 706 and 708, different from FIG. 7, which shows the emitter of BJTs 530 and 532 as $N^+$ region 514. Therefore, the heat dissipation area of BJTs 730 and 732 is much larger compared to that of BJTs 530 and 532. Consequently, the stability of the device is improved.

Figure 12:
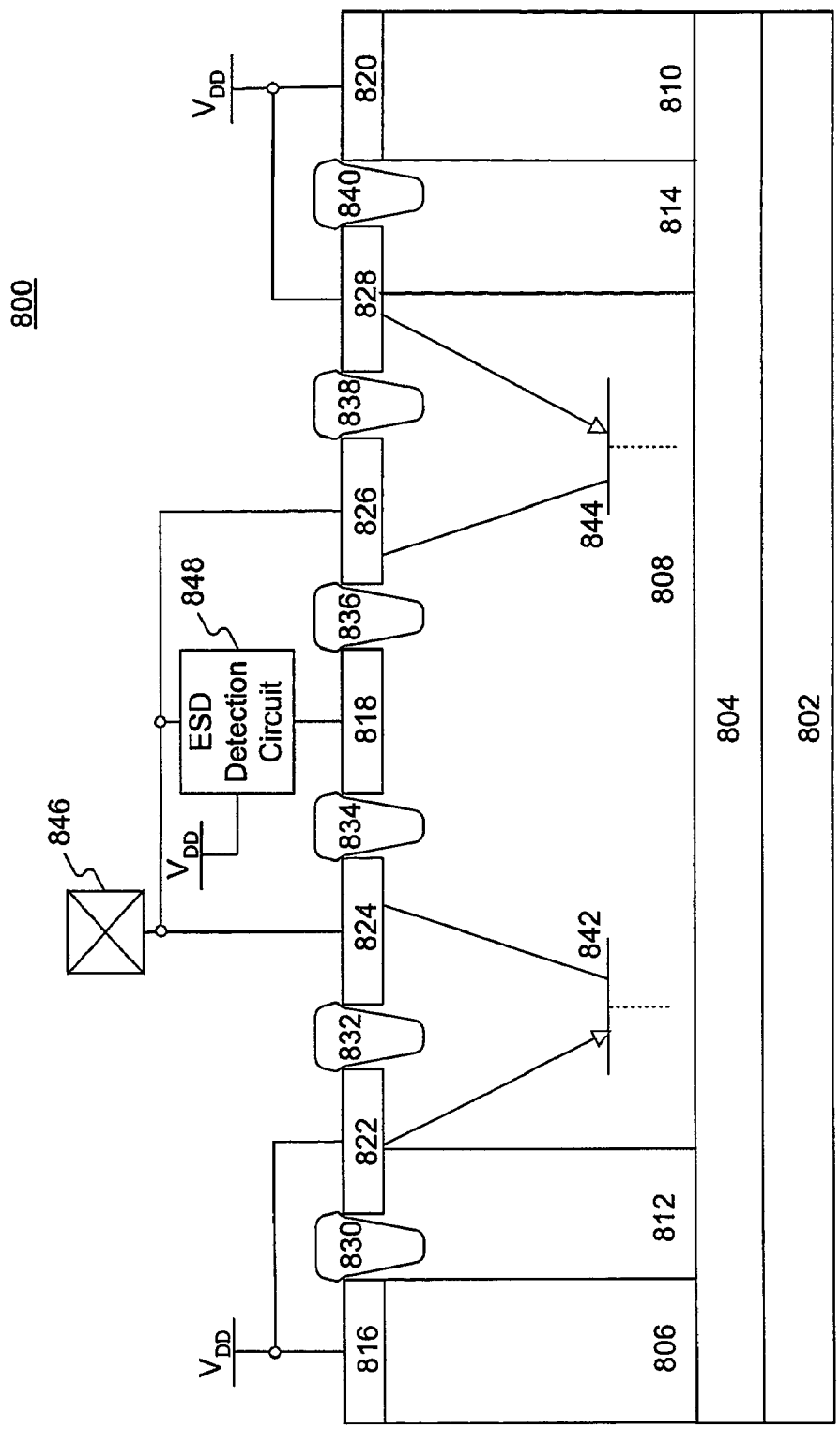
FIG. 12 is the cross-sectional view of a bipolar device suitable for providing ESD protections consistent with yet another embodiment of the present invention.

FIG. 12 shows a bipolar device 800 including PNP BJTs that have large heat dissipation areas consistent with a sixth embodiment of the present invention. Referring to FIG. 12, bipolar device 800 is formed in a semiconductor substrate 802. A plurality of N-wells 804, 806, 808, and 810, and two P-wells 812 and 814 are formed in substrate 802, wherein N-well 804 is formed deep in substrate 802 and isolates substrate 802 from N-wells 806, 808, and 810, and P-wells 812 and 814. P-well 812 is formed adjacent to N-well 806, N-well 808 is formed adjacent to P-well 812, P-well 814 is formed adjacent to N-well 808, and N-well 810 is formed adjacent to P-well 814. Also formed in substrate 802 are a plurality of diffusion regions, including $N^+$ regions 816, 818, and 820, and $P^+$ regions 822, 824, 826, and 828, wherein $N^+$ region 816 is formed in N-well 806, $N^+$ region 818 is formed in N-well 808, $N^+$ region 820 is formed in N-well 810, $P^+$ region 822 is formed in both P-well 812 and N-well 808, $P^+$ regions 824 and 826 are both formed in N-well 808, and $P^+$ region 828 is formed in both N-well 808 and P-well 814.

Diffusion regions 816, 818, 820, 822, 824, 826, and 828 are electrically isolated by a plurality of isolation regions 830, 832, 834, 836, 838, and 840. Isolation region 830 electrically isolates $N^+$ region 816 from $P^+$ region 822; isolation region 832 electrically isolates $P^+$ region 822 from $P^+$ region 824; isolation region 834 electrically isolates $P^+$ region 824 from $N^+$ region 818; isolation region 836 electrically isolates $N^+$ region 818 from $P^+$ region 826; isolation region 838 electrically isolates $P^+$ region 826 from $P^+$ region 828; and isolation region 840 electrically isolates $P^+$ region 828 from $N^+$ region 820. In one aspect, isolation regions 830, 832, 834, 836, 838, and 840 are STIs. In another aspect, isolation regions 830, 832, 834, 836, 838, and 840 are LOCOS.

As shown in FIG. 12, $P^+$ region 824, N-well 808, and P-well 812 collectively form a parasitic PNP BJT 842, and $P^+$ regions 826, N-well 808, and P-well 814 collectively form a parasitic PNP BJT 844, wherein $P^+$ region 824 is the collector of BJT 842, $P^+$ region 826 is the collector of BJT 844, N-well 808 is the base of both BJTs 842 and 844, P-well 812 is the emitter of BJT 842, and P-well 814 is the emitter of BJT 844.

In an exemplary application of bipolar device 800, $N^+$ regions 816 and 820, and $P^+$ regions 822 and 828 are all connected to a positive power supply $V_{DD}$. $P^+$ regions 824 and 826 are both coupled to a contact pad 846 to receive an ESD current in an ESD event. An ESD detection circuit 848 is coupled between contact pad 846 and $N^+$ region 818 to detect the ESD. A terminal (not numbered) of ESD detection circuit 848 is also connected to $V_{DD}$.

When a negative ESD current appears on contact pad 846, ESD detection circuit 848 detects the ESD and generates a trigger current or trigger voltage at $N^+$ region 818, which then triggers or turns on BJTs 842 and 844 to conduct the negative ESD current from $P^+$ regions 824 and 826 to $P^+$ regions 822 and 828, respectively.

For the reasons already discussed above, the structure of bipolar device 800 also provides for a better heat dissipation and therefore the stability thereof is improved.

Figure 13:
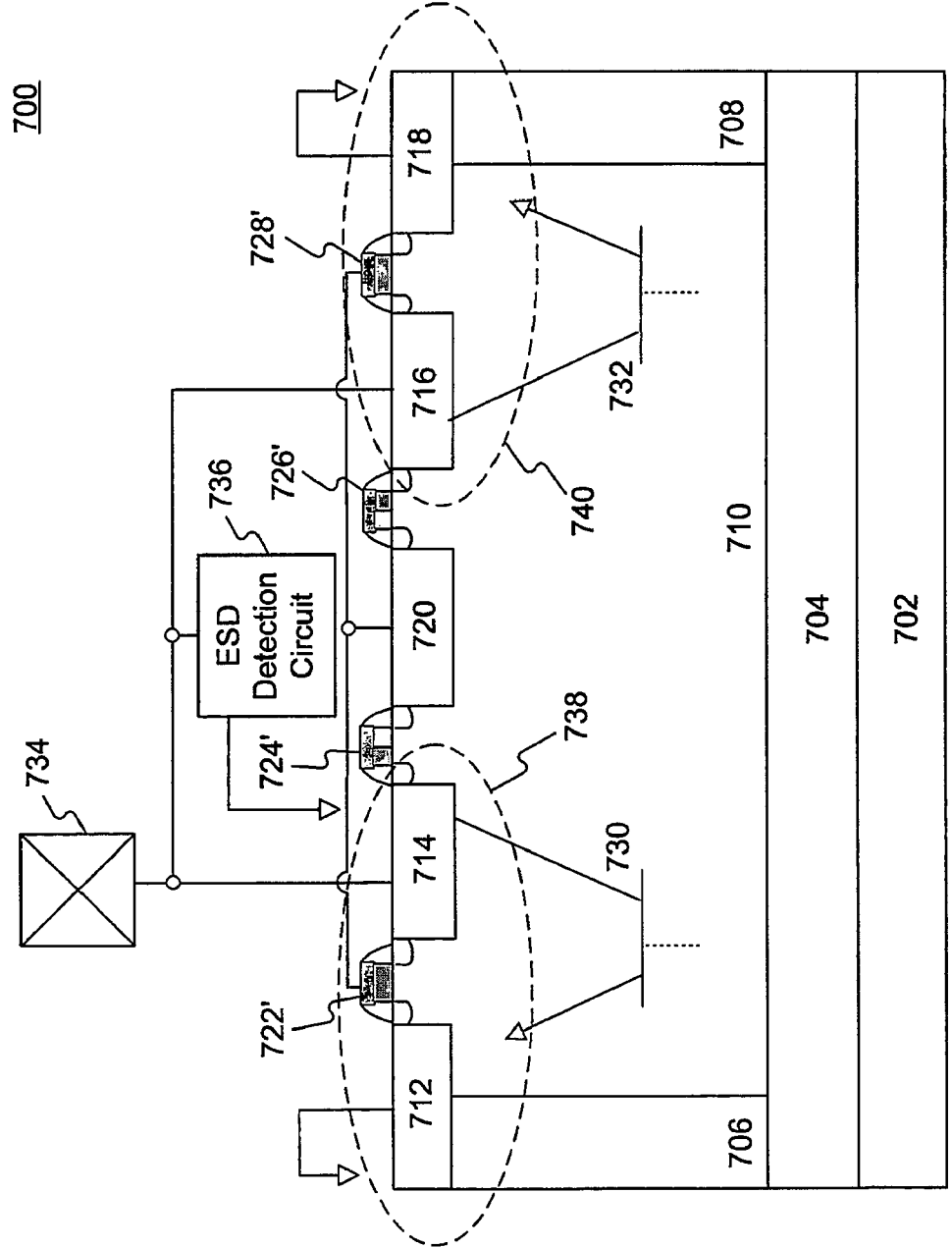
FIG. 13 is the cross-sectional view of another bipolar device suitable for providing ESD protections also consistent with the embodiment shown in FIG. 11.

Furthermore, the isolation regions in bipolar devices 700 and 800 may also be replaced with dummy gates. As shown in FIG. 13, isolation regions 722, 724, 726, and 728 of bipolar device 700 have been replaced with dummy gate structures 722', 724', 726', and 728', respectively, without modifying the remaining structures.

In one aspect, the gate of each of the gate structures 724' and 726' is doped with both $P^+$ and $N^+$ dopants, while gate structures 722' and 728' are both doped with $N^+$ dopant. As indicated by the dashed circles in FIG. 13, two n-type MOS transistors 738 and 740 are formed, with $N^+$ regions 712 and 714 being the source and drain of MOS transistor 738, $N^+$ regions 716 and 718 being the source and drain of MOS transistor 740, and P-well 710 being the substrate of both NMOS transistors 738 and 740. In one aspect, both of the gates of NMOS transistors 738 and 740, i.e., gates 722' and 728', are coupled to ESD detection circuit 736 to receive the trigger current or trigger voltage to trigger or turn on BJTs 730 and 732. Therefore, BJTs 730 and 732 may be turned on more quickly.

Figure 14:
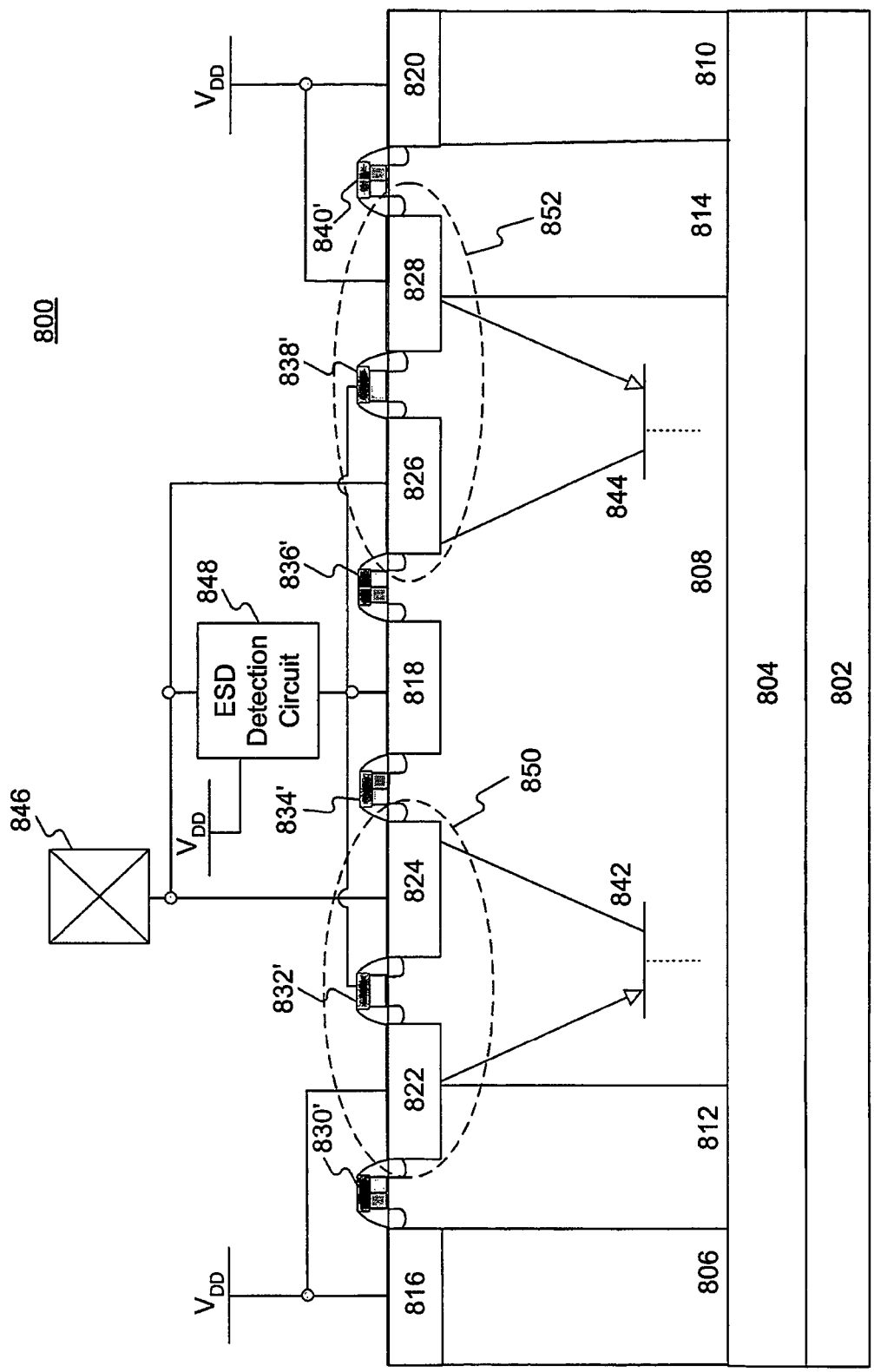
FIG. 14 is the cross-sectional view of another bipolar device suitable for providing ESD protections also consistent with the embodiment shown in FIG. 12.

Referring to FIG. 14, isolation regions 830, 832, 834, 836, 838, and 840 have been replaced with dummy gate structures 830', 832', 834', 836', 838', and 840', respectively, without modifying the remaining structures in one aspect, the gate of each of the gate structures 830', 834', 836', and 840' is doped with both P⁺ and N⁺ dopants, while gate structures 832' and 838' are both doped with N⁺ dopant. As indicated by the dashed circles in FIG. 14, two p-type MOS transistors 850 and 852 are formed, wherein P⁺ regions 822 and 824 are the source and drain of MOS transistor 850, P⁺ regions 826 and 828 are the source and drain of MOS transistor 852, and N-well 808 is the substrate of both NMOS transistors 850 and 852. In one aspect, both of the gates of NMOS transistors 850 and 852, i.e., gates 832' and 838', are coupled to ESD detection circuit 848 to receive the trigger current or trigger voltage, thereby triggering or turning on BJTs 842 and 844. Therefore, BJTs 842 and 844 may be turned on more quickly.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a semiconductor substrate;
   a first well formed in the substrate;
   a second well formed in the substrate;
   a first doped region formed in the second well, the first doped region has a conductivity type that is the same as the first well;
   a second doped region formed in both the first well and the second well, the second doped region has a conductivity type that is the same as the second well; and
   an electrostatic discharge (ESD) detection circuit coupled to a contact pad and the second doped region, the ESD detection circuit is configured to provide a trigger current to the second doped region if an ESD event is detected;
   wherein the first well, the second well, and the first doped region collectively form a parasitic bipolar junction transistor (BJT).

2. The semiconductor device of claim 1, wherein the first well comprises a collector of the BJT, the second well comprises a base of the BJT, and the first doped region comprises an emitter of the BJT.

3. The semiconductor device of claim 1, wherein the first well comprises an n-type well, the second well comprises a p-type well, the first doped region comprises an n-type region, and the parasitic BJT comprises an NPN BJT.

4. The semiconductor device of claim 1, wherein the first well comprises a p-type well, the second well comprises an n-type well, the first doped region comprises a p-type region, and the parasitic BJT comprises a PNP BJT.

5. The semiconductor device of claim 1, further comprising a third doped region formed in the first well, wherein the third doped region has a conductivity type that is the same as the first well.

6. The semiconductor device of claim 5, wherein the first doped region is configured to couple to a power supply, wherein the third doped region is configured to couple to the ESD detection circuit, and the ESD detection circuit is configured to detect an ESD current.

7. The semiconductor device of claim 6, wherein, in response to the trigger current, the parasitic BJT is configured to conduct the ESD current from the second doped region to the first doped region.

8. The semiconductor device of claim 6, wherein the BJT comprises an NPN BJT, and wherein the first doped region is configured to couple to a ground terminal of the power supply.

9. The semiconductor device of claim 6, wherein the BJT comprises a PNP BJT, and wherein the first doped region is configured to couple to a positive supply voltage terminal of the power supply.

10. The semiconductor device of claim 6, further comprising a fourth doped region formed in the second well, wherein the fourth doped region has a conductivity type that is the same as the second well, wherein the fourth doped region comprises a contact to the second well, wherein the third doped region and the fourth doped region are spaced apart from each other, and wherein the fourth doped region is configured to couple to the power supply.

11. The semiconductor device of claim 1, further comprising a third doped region formed in the substrate; and a fourth doped region formed in the second well; wherein the first, second, third, and fourth doped regions are electrically isolated from each other by a plurality of isolation regions.

12. The semiconductor device of claim 11, wherein the isolation regions comprise shallow trench isolations (STIs).

13. The semiconductor device of claim 11, wherein the isolation regions comprise oxidation of silicon (LOCOS) regions.

14. The semiconductor device of claim 1, further comprising a third doped region formed in the substrate; a fourth doped region formed in the second well; and a plurality of dummy gate structures that electrically isolate the first, second, third, and fourth doped regions from each other.

15. The semiconductor device of claim 14, wherein a gate of each dummy gate structure is doped with both P⁺ and N⁺ dopants, wherein a portion of each gate proximate a p-type doped region is doped with P⁺ dopant, and wherein a portion of each gate proximate an n-type doped region is doped with N⁺ dopant.

16. The semiconductor device of claim 1, wherein in response to the trigger signal the BJT is configured to discharge current in the ESD event.

17. The semiconductor device of claim 1, wherein the trigger signal comprises a trigger current.

18. The semiconductor device of claim 1, wherein the trigger signal comprises a trigger voltage.

19. An apparatus, comprising:
   a first well formed in a semiconductor substrate;
   a second well formed in the substrate adjacent to the first well, wherein the second well is of a different conductivity type than the first well;
   a first doped region formed in both the first well and the second well, wherein the first doped region is of the same conductivity type as the first well;
   a second doped region formed in the first well, wherein the second doped region is of the same conductivity type as the first well;
   a third doped region formed in the first well between the first and second doped regions, wherein the third doped region is of a different conductivity type than the first well; and
   an electrostatic discharge (ESD) detection circuit coupled to a contact pad and the first doped region, the ESD detection circuit is configured to provide a trigger current to the first doped region if an ESD event is detected.

20. The apparatus of claim 19, wherein the first well comprises a p-well, the second well comprises a n-well and the first doped region comprises a p-type doped region.

21. The apparatus of claim 20, further comprising: a third well formed in the substrate adjacent to the first well and spaced apart from the second well, wherein the third well is of a same conductivity type as the second well, and wherein the second doped region is formed in both the first well and the third well.

22. The apparatus of claim 19, wherein the first well comprises an n-well, the second well comprises a p-well, and the first doped region comprises an n-type doped region.

23. The apparatus of claim 19, further comprising: a plurality of isolation regions configured to electrically isolate the first, second, and third doped regions from each other.

24. The apparatus of claim 23, wherein the isolation regions comprise shallow trench isolations (STIs).

25. The apparatus of claim 23, wherein the isolation regions comprise oxidation of silicon (LOCOS) regions.

26. The apparatus of claim 23, wherein the isolation regions comprise dummy gate structures.

27. The apparatus of claim 23, wherein the first well, the second well, and the third doped region comprise, respectively, a collector, a base, and an emitter of a parasitic bipolar junction transistor (BJT), and wherein the parasitic BJT is configured to discharge an electrostatic discharge (ESD) current in response to the trigger signal.

28. The apparatus of claim 19, wherein the trigger signal comprises a trigger current.

29. The apparatus of claim 19, wherein the trigger signal comprises a trigger voltage.

* * * * *